(12) United States Patent
Ogata et al.

(10) Patent No.: US 8,539,906 B2
(45) Date of Patent: Sep. 24, 2013

(54) SUBSTRATE LIQUID PROCESSING APPARATUS

(75) Inventors: Nobuhiro Ogata, Koshi (JP); Shuichi Nagamine, Koshi (JP)

(73) Assignee: Tokyo Electron Limited, Minato-Ku (JP)

(*) Notice: Subject to any disclaimer, the term of this patent is extended or adjusted under 35 U.S.C. 154(b) by 167 days.

(21) Appl. No.: 13/151,665

(22) Filed: Jun. 2, 2011

(65) Prior Publication Data

US 2012/0153044 A1 Jun. 21, 2012

(30) Foreign Application Priority Data

Dec. 17, 2010 (JP) ................................ 2010-281793

(51) Int. Cl.
*B05B 1/28* (2006.01)
*B05B 13/02* (2006.01)
*B05C 11/02* (2006.01)

(52) U.S. Cl.
USPC ............. 118/326; 118/52; 118/612; 118/319; 118/320

(58) Field of Classification Search
USPC ............. 118/326, 52, 56, 319, 320, 313–315; 134/153, 198, 94.1, 902; 396/611, 604, 627; 427/240
See application file for complete search history.

(56) References Cited

U.S. PATENT DOCUMENTS

| 5,626,675 A | * | 5/1997 | Sakamoto et al. | 118/663 |
| 7,122,084 B2 | * | 10/2006 | Hohenwarter | 118/326 |
| 2002/0195128 A1 | * | 12/2002 | Shibagaki | 134/26 |
| 2006/0222315 A1 | | 10/2006 | Yoshida | |
| 2007/0163711 A1 | | 7/2007 | Koo et al. | |
| 2009/0293914 A1 | | 12/2009 | Aratake et al. | |

FOREIGN PATENT DOCUMENTS

| JP | 10-323633 A1 | 12/1998 |
| JP | 2000-183010 A1 | 6/2000 |
| JP | 2004-158482 A1 | 6/2004 |
| JP | 2004-265912 A1 | 9/2004 |
| JP | 2006-286832 A1 | 10/2006 |
| JP | 2007-189232 A1 | 7/2007 |
| JP | 2009-295662 A1 | 12/2009 |

OTHER PUBLICATIONS

Japanese Office Action dated Jan. 18, 2013.
U.S. Appl. No. 13/151,577, filed Jun. 2, 2011, Ogata et al.
U.S. Appl. No. 13/151,610, filed Jun. 2, 2011, Ogata et al.

* cited by examiner

*Primary Examiner* — Yewebdar Tadesse
(74) *Attorney, Agent, or Firm* — Burr & Brown

(57) ABSTRACT

A substrate liquid processing apparatus of the present invention includes a guide rotary cup configured to guide a process-liquid scattering from a substrate rotating and being held by a substrate holding table and a guide cup configured to guide downward the process-liquid guided by the guide rotary cup. The guide cup includes a downward extension portion extending downward from an inner peripheral end portion of a guide cup body and an inner peripheral extension portion extending inward from the inner peripheral end portion more than the downward extension portion. The inner peripheral extension portion is configured to form a gas guide space together with the guide rotary cup and the downward extension portion so that a gas turning by the rotation of the guide rotary cup can be guided downward.

7 Claims, 4 Drawing Sheets

SUBSTRATE LIQUID PROCESSING APPARATUS

CROSS REFERENCE TO RELATED APPLICATIONS

This application is based upon and claims the benefit of priority from the prior Japanese Patent Application No. 2010-281793, filed on Dec. 17, 2010; the entire contents of which are incorporated herein by reference.

FIELD OF THE INVENTION

The present invention relates to a substrate liquid processing apparatus for processing a substrate with a process-liquid.

BACKGROUND OF THE INVENTION

In the process of manufacturing semiconductor products or flat-panel displays (FPDs), a liquid process has been frequently used which supplies a process-liquid to a semiconductor wafer or a glass substrate as a substrate to be processed. Examples of such a process include a cleaning process of removing particles or contaminants adhering to the substrate and the like.

As a liquid processing apparatus performing the liquid process, there has been known a single-wafer-type process unit that holds a substrate such as a semiconductor wafer with a spinning chuck and performs a process on the substrate by supplying a process-liquid (a chemical liquid, a rinse liquid, or the like) to the front and/or rear surface of the rotating substrate.

The process-liquid supplied to the substrate is thrown off from the rotating substrate and is changed into mist, scattering around a substrate holding table. In order to recover the scattering mist, Japanese Patent Application Laid-Open (JP-A) No. 10-323633 discloses a substrate processing apparatus including a scattering prevention cup that guides a cleaning liquid thrown off from a substrate to a cleaning liquid recovery path.

SUMMARY OF THE INVENTION

However, in the substrate processing apparatus disclosed in JP-A No. 10-323633, the scattering prevention cup with a very large opening is located above the substrate. Further, since the substrate rotates during the liquid process, an outward air current is generated above the scattering prevention cup. Accordingly, a portion of the cleaning liquid (with mist therein) thrown off from the substrate and rebounding on the inner surface of the scattering prevention cup moves upward via the opening of the scattering prevention cup due to the influence of the air current, floats above the scattering prevention cup, and moves downward via the opening of the scattering prevention cup at last. For this reason, there is a problem that the cleaning liquid adheres to the substrate again.

The present invention is made in view of such circumstances, and an object thereof is to provide a substrate liquid processing apparatus capable of preventing a process-liquid that has scattered from a substrate from adhering to the substrate again.

The present invention provides a substrate liquid processing apparatus comprising: a substrate holding table configured to hold a substrate; a rotary driving unit configured to rotate the substrate holding table; a process-liquid supply unit configured to supply a process-liquid to the substrate held by the substrate holding table; a guide rotary cup provided around the substrate holding table, the guide rotary cup being configured to rotate together with the substrate holding table to guide the process-liquid scattering from the rotating substrate; and a guide cup provided around the guide rotary cup, the guide cup being configured to guide downward the process-liquid guided by the guide rotary cup, wherein the guide cup includes a guide cup body, a downward extension portion extending downward from an inner peripheral end portion of the guide cup body, and an inner peripheral extension portion extending inward from the inner peripheral end portion more than the downward extension portion, the inner peripheral extension portion being configured to form a gas guide space together with the guide rotary cup and the downward extension portion so that a gas turning by the rotation of the guide rotary cup is guided downward.

According to the present invention, a process-liquid scattering from a substrate may be prevented from adhering to the substrate again, and generation of particles may be suppressed.

DETAILED DESCRIPTION OF THE INVENTION

Figure 1:
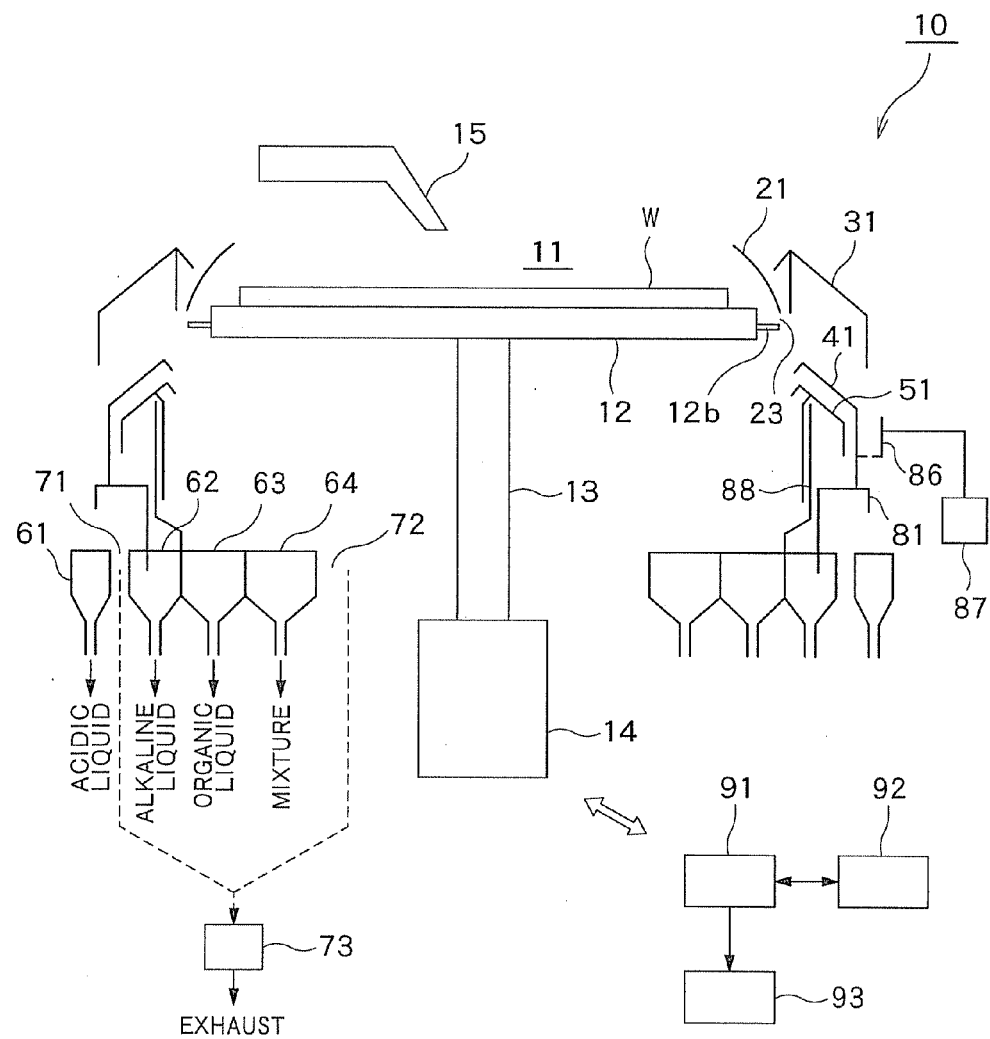
FIG. 1 is a configuration diagram schematically illustrating a substrate liquid processing apparatus of an embodiment of the present invention.

Embodiment of a substrate liquid processing apparatus according to the present invention described above will be described.

In the substrate liquid processing apparatus according to the embodiment of the present invention, it is preferable that the process-liquid supply unit is configured to selectively supply a plurality of types of process-liquids, that the substrate liquid processing apparatus further comprises a second guide cup provided below the guide cup, the second guide cup being configured to guide downward the corresponding process-liquid guided by the guide rotary cup; and an up-down movement driving unit configured to move up and down the second guide cup with respect to the guide cup, and that the downward extension portion of the guide cup closes an opening of the guide cup when the process-liquid is guided by the second guide cup.

In addition, in the substrate liquid processing apparatus according to the embodiment of the present invention, it is preferable that the above substrate liquid processing apparatus further comprising a third guide cup provided below the second guide cup, the third guide cup being configured to guide downward the corresponding process-liquid guided by the guide rotary cup, that the third guide cup is configured to be able to be moved up and down together with the second guide cup, and that a gap between the guide cup and the second guide cup is blocked when the process-liquid is guided by the third guide cup, and the downward extension portion of the guide cup closes an opening of the second guide cup.

In addition, in the substrate liquid processing apparatus according to the embodiment of the present invention, it is preferable that an up-down moving groove is provided at an outer peripheral end portion of the guide cup body, that the second guide cup and the up-down movement driving unit are connected to each other by a connection member, and that the connection member is configured to be able to be moved up and down in the up-down moving groove.

In addition, in the substrate liquid processing apparatus according to the embodiment of the present invention, it is preferable that the guide cup body includes a sloped portion extending obliquely downward and outward and a vertical portion extending downward in a vertical direction from an outer peripheral end portion of the sloped portion, and that the second guide cup is configured to be able to be moved up and down in a space between the downward extension portion of the guide cup and the vertical portion of the guide cup body.

In addition, in the substrate liquid processing apparatus according to the embodiment of the present invention, it is preferable that a cross-section from the inner peripheral extension portion of the guide cup to the downward extension portion is formed in a reverse U-shape.

In addition, in the substrate liquid processing apparatus according to the embodiment of the present invention, it is preferable that a gap portion is formed between an outer peripheral end portion of the guide rotary cup and an outer peripheral end portion of the substrate holding table so that the process-liquid scattering from the substrate passes through the gap portion, and that a lower end portion of the downward extension portion of the guide cup is disposed above the gap portion.

In addition, in the substrate liquid processing apparatus according to the embodiment of the present invention, it is preferable that the vertical positional relationship between the guide rotary cup and the guide cup is maintained constant.

Hereinafter, the substrate liquid processing apparatus of an embodiment of the present invention will be described by referring to the accompanying drawings in detail.

Figure 2:
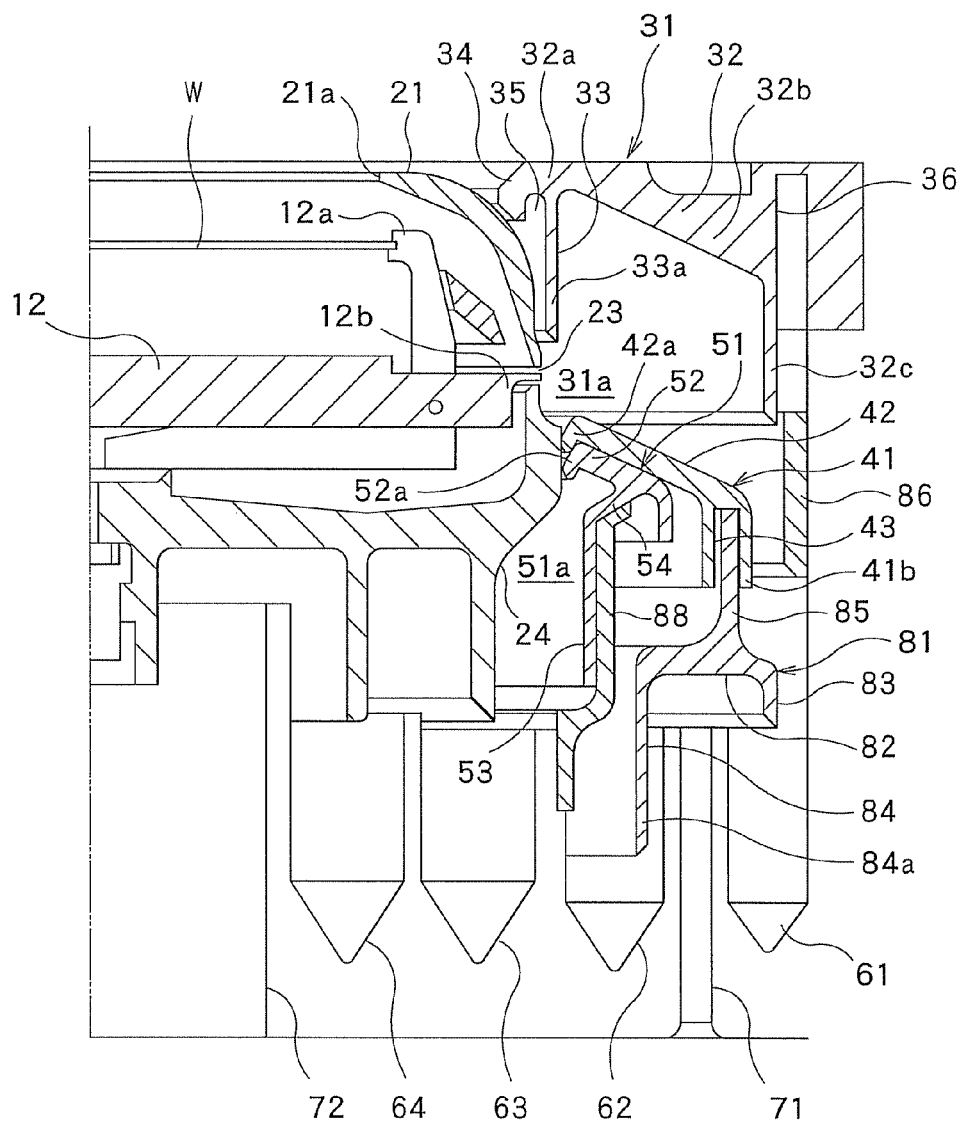
FIG. 2 is a cross-sectional view specifically illustrating the substrate liquid processing apparatus during an acidic process in the embodiment of the present invention.

As shown in FIGS. 1 and 2, a substrate liquid processing apparatus 10 includes a single-wafer-type liquid processing chamber 11 and a substrate holding table 12. A substrate (for example, a semiconductor wafer, and hereinafter, simply referred to as a wafer W) is loaded into and unloaded from the single water type liquid processing chamber 11 one by one so that the substrate can be processed in the single-water-type liquid processing chamber 11. The substrate holding table 12 is provided inside the liquid processing chamber 11 in a freely rotatable manner and holds the wafer W thereon. The substrate holding table 12 is connected with a rotary motor (a rotary driving unit) 14 configured to rotate the substrate holding table 12 via a rotary driving shaft 13. The wafer W is held by a holding member 12a at the peripheral edge portion of the substrate holding table 12, and rotates within a horizontal plane by driving the rotary motor 14.

The liquid processing chamber 11 is provided with a nozzle (a process-liquid supply unit) 15 which selectively ejects (supplies) a plurality of types of process-liquids to the wafer W held by the substrate holding table 12. That is, the nozzle 15 is selectively connected with a supply source (not shown) of an acidic process-liquid, an alkaline process-liquid, a rinse process-liquid, and an organic process-liquid, and selectively ejects the process-liquids onto the surface of the wafer W. Furthermore, as the acidic process-liquid, for example, an SPM solution (a solution obtained by mixing sulfuric acid with hydrogen peroxide water), an HF solution (hydrogen fluoride), an SC2 solution (a solution obtained by mixing hydrochloric acid with hydrogen peroxide water), or the like may be used. As the alkaline process-liquid, for example, an SC1 solution (ammonia hydrogen peroxide mixture), ammonia water, or the like may be used. Further, as the rinse process-liquid, for example, pure water or the like may be used. As the organic process-liquid, for example, an IPA solution (an isopropyl alcohol solution) or the like may be used.

A guide rotary cup 21 is provided around the substrate holding table 12 to rotate together with the substrate holding table 12 and guide the process-liquid scattering from the rotating wafer W or mist thereof. The guide rotary cup 21 has an upper opening 21a, and is formed in an annular shape as a whole. In regard to the guide rotary cup 21, the diameter of the opening of the lower end portion is larger than that of an upper opening 21a, and the vertical cross-section thereof is in the shape of an upward convex curve. That is, as shown in FIG. 2, the guide rotary cup 21 is formed in a manner of extending outward from its upper peripheral edge of the wafer W in the radial direction of the wafer W.

The substrate holding table 12 includes an outer peripheral end portion 12b which extends toward the lower side of the guide rotary cup 21. A gap portion 23 is present between the outer peripheral end portion 12b and the lower end portion of the guide rotary cup 21, and the process-liquid that scatters from the wafer W and is guided by the guide rotary cup 21 is guided further outside the guide rotary cup 21 via the gap portion 23.

As shown in FIG. 2, a holding table lower member 24 is provided below the substrate holding table 12. The holding table lower member 24 is fixed to the liquid processing chamber 11, and is configured to further guide downward the process-liquid guided by a third guide cup 51 to be described later and an atmosphere around the wafer W at that time.

A first guide cup (a guide cup) 31, a second guide cup 41, and a third guide cup 51 are provided in this order from the top around the guide rotary cup 21 to guide downward the corresponding process-liquids guided by the guide rotary cup 21. Among these, the first guide cup 31 guides the acidic process-liquid, the second guide cup 41 guides the alkaline process-liquid, and the third guide cup 51 guides the organic process-liquid. Furthermore, the first guide cup 31 may guide the alkaline process-liquid, and the second guide cup 41 may guide the acidic process-liquid. Further, each of the guide cups 31, 41, and 51 is formed in an annular shape as a whole, the first guide cup 31 is fixed to the liquid processing chamber 11, and the second guide cup 41 is connected to an up-down movement cylinder 87 to be described later to be able to be freely moved up and down with respect to the first guide cup 31. The third guide cup 51 is configured to be able to be freely moved up and down together with the second guide cup 41 in a partial range of the up-down movement range of the second guide cup 41.

The first guide cup 31 includes a first guide cup body (a guide cup body) 32 and a first downward extension portion (a downward extension portion) 33 extending downward from an inner peripheral end portion 32a of the first guide cup body 32. Among these, the first guide cup body 32 includes a sloped portion 32b extending obliquely downward and outward and a vertical portion 32c extending downward in the vertical direction from the outer peripheral end portion of the sloped portion 32b, and guides downward the acidic process-liquid. Furthermore, the inner peripheral end portion 32a of the first guide cup body 32 is located above the outer peripheral end portion area of the guide rotary cup 21. Further, a lower end portion 33a of a first downward extension portion 33 is disposed adjacent to and above the gap portion 23. In this manner, the first downward extension portion 33 prevents the stream of the process-liquid from the gap portion 23 from being interrupted, and covers the outer peripheral portion (the portion near the first guide cup 31) of the guide rotary cup 21. The first downward extension portion 33 is configured to close an opening 31a of the first guide cup 31 when the alkaline process-liquid is guided by the second guide cup 41 (see FIG. 4). Furthermore, the first downward extension portion 33 is configured to close an opening 41a of the second guide cup 41 when the organic process-liquid is guided by the third guide cup 51 (see FIG. 5). At this time, the gap between the first guide cup 31 and the second guide cup 41 is blocked. Here, the "closing" does not mean a concept of perfect sealing of an opening but means a concept of closing most of the opening, allowing a clearance to the extent that can be considered to be able to prevent the process-liquid or the like from flowing into the opening. In the same manner, the "blocking" does not mean of a concept of perfect sealing of a gap between two guide cups but means a concept of allowing two guide cups to be closer to each other, with a clearance therebetween to the extent that can be considered to be able to prevent the process-liquid or the like from flowing through the gap.

An inner peripheral extension portion 34 extends inward from the inner peripheral end portion 32a of the first guide cup body 32 more than the first downward extension portion 33. Then, a gas guide space 35 is formed by the first downward extension portion 33, the inner peripheral extension portion 34, and the guide rotary cup 21. The gas guide space 35 is used to guide downward a gas turning by the rotation of the guide rotary cup 21. That is, although the gas inside the gas guide space 35 turns along the first downward extension portion 33 due to the centrifugal force exerted thereon, the turning gas is guided downward along the first downward extension portion 33 since the inner peripheral extension portion 34 is provided at the upper portion of the gas guide space 35. Furthermore, in the embodiment, the inner peripheral extension portion 34 extends downward from the guide rotary cup 21 along the first downward extension portion 33, and the cross-section from the inner peripheral extension portion 34 to the first downward extension portion 33 is formed in a reverse U-shape. Further, although the distal end of the inner peripheral extension portion 34 is adjacent to the outer peripheral surface of the guide rotary cup 21, a predetermined clearance is present between the front end of the inner peripheral extension portion 34 and the outer peripheral surface of the guide rotary cup 21 so as to prevent an interference therebetween. Further, an up-down moving groove 36 is formed in the outer peripheral end portion of the first guide cup body 32, and a connection member 86 to be described later is provided in the up-down moving groove 36 to be able to be moved up and down.

Figure 4:
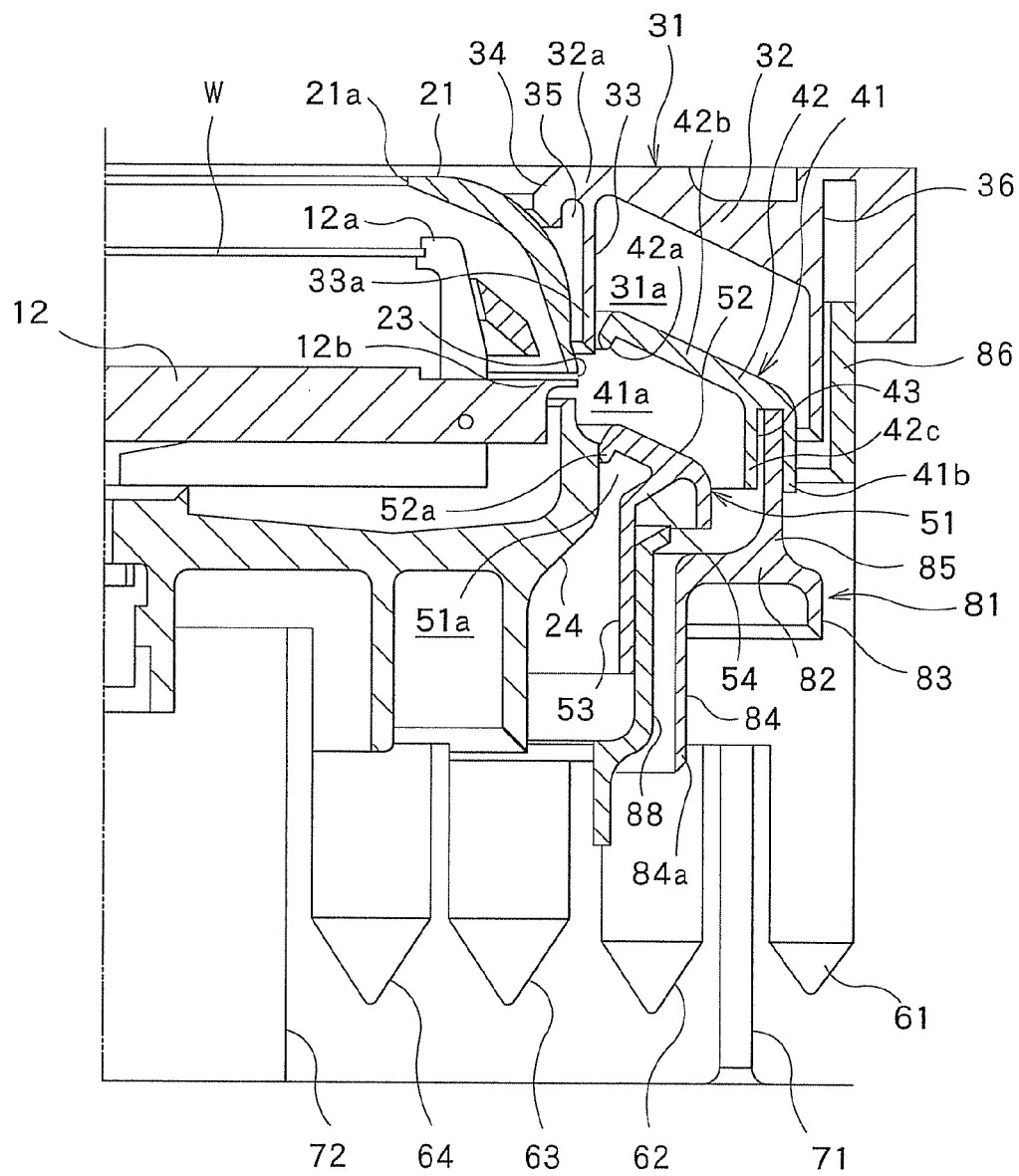
FIG. 4 is a cross-sectional view specifically illustrating the substrate liquid processing apparatus during an alkaline process in the embodiment of the present invention.

As shown in FIG. 4, the second guide cup 41 includes a second guide cup body 42 and a fitting groove 43 to which a fitting portion 85 of a guide member 81 to be described later is fitted. Among these, the second guide cup body 42 includes a sloped portion 42b extending obliquely downward and outward and a vertical portion 42c extending downward in the vertical direction from the outer peripheral end portion of the sloped portion 42b, and guides downward the alkaline process-liquid. An inner peripheral end portion 42a of the second guide cup body 42 is disposed at the outer periphery more than the first downward extension portion 33 of the first guide cup 31, the vertical portion 42c of the second guide cup body 42 is disposed at the inner periphery more than the vertical portion 32c of the first guide cup body 32, and the second guide cup 41 is configured to be able to be moved up and down in a space between the first downward extension portion 33 and the vertical portion 32c of the first guide cup body 32. Further, the fitting groove 43 is formed in the vertical portion 42c of the second guide cup body 42.

Figure 5:
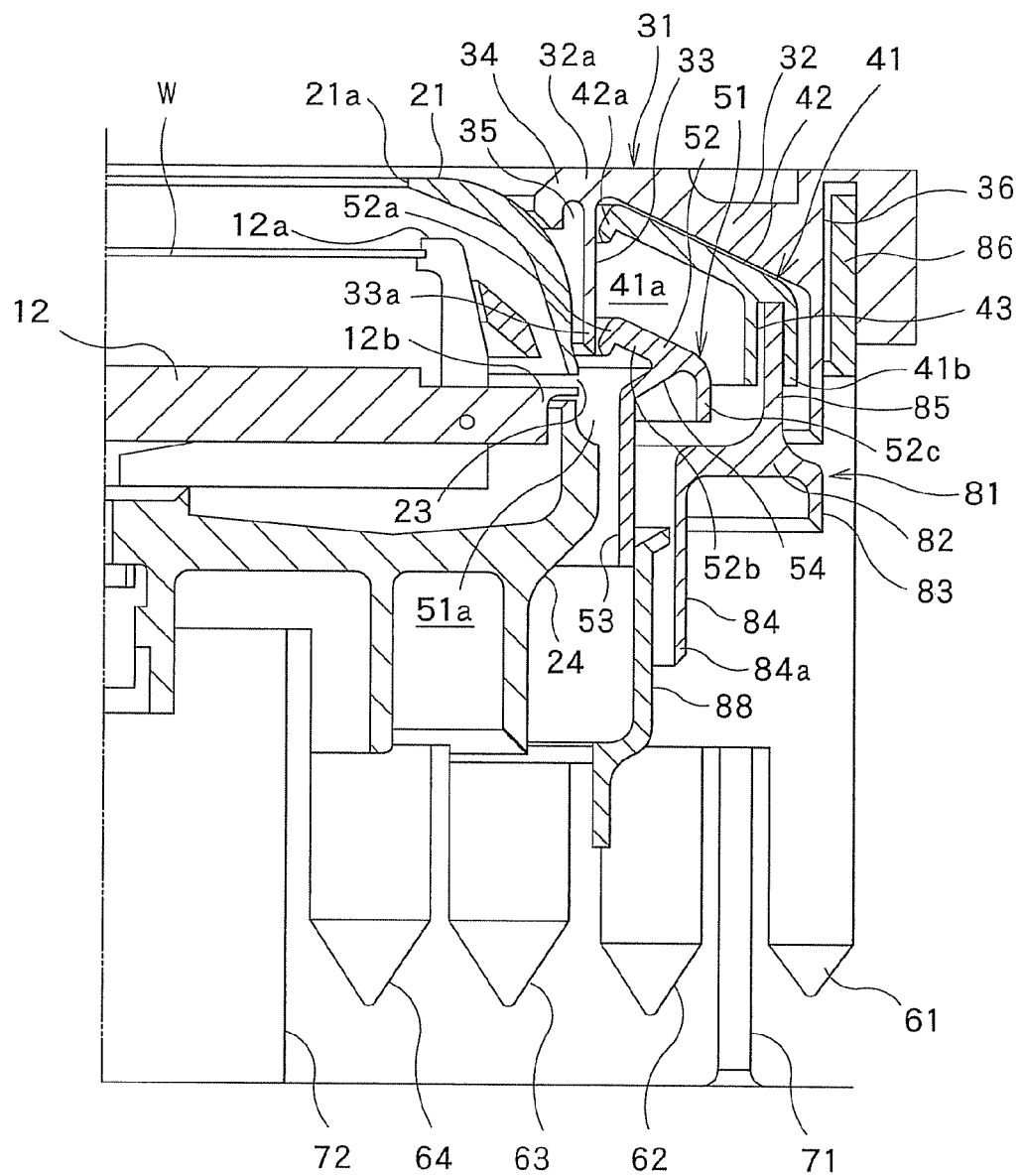
FIG. 5 is a cross-sectional view specifically illustrating the substrate liquid processing apparatus during a drying process in the embodiment of the present invention.

As shown in FIG. 5, the third guide cup 51 includes a third guide cup body 52 and a third downward extension portion 53 connected to the third guide cup body 52 via a contact portion 54 to extend downward. Among these, the third guide cup body 52 includes a sloped portion 52b extending obliquely downward and outward and a vertical portion 52c extending downward in the vertical direction from the outer peripheral end portion of the sloped portion 52b. The vertical portion 52c is disposed at the inner periphery more than the vertical portion 42c of the second guide cup body 42, and the inner peripheral end portion 52a of the third guide cup body 52 is disposed at the outer periphery more than the first downward extension portion 33 of the first guide cup 31 and the holding table lower member 24. The third downward extension portion 53 is connected to the sloped portion 52b of the third guide cup body 52 via the inclined contact portion 54, and is configured to guide downward the organic process-liquid together with the sloped portion 52b and the contact portion 54. Further, the third downward extension portion 53 is configured to be able to slide along a defining wall 88 to be described later. The contact portion 54 is configured to freely come into contact with the upper end portion of the defining wall 88 (see FIG. 2), and when the contact portion 54 comes into contact with the upper end portion of the defining wall 88, the third guide cup 51 is supported by the defining wall 88.

Figure 3:
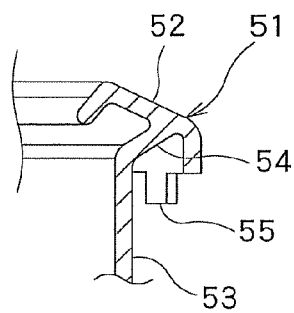
FIG. 3 is a diagram illustrating a third guide cup in the substrate liquid processing apparatus of the embodiment of the present invention.

As shown in FIG. 3, the outer peripheral end portion (the vertical portion 52c) of the third guide cup body 52 is provided with a protrusion 55 which freely comes into contact with a guide member body 82 of a guide member 81 to be described later. A plurality of the protrusions 55 are provided at several positions at a predetermined interval therebetween in the circumferential direction. The third guide cup 51 is supported by the second guide cup 41 in a manner such that each protrusion 55 comes into contact with the guide member body 82. Then, when the third guide cup 51 is supported by the second guide cup 41, the second guide cup 41 is moved up and down together with the third guide cup 51. Further, when the third guide cup 51 is not supported by the second guide cup 41, that is, when the third guide cup 51 is supported by the defining wall 88, the second guide cup 41 is moved up and down independently from the third guide cup 51. That is, the third guide cup 51 is configured to be moved up and down together with the second guide cup 41 in a partial range of the up-down movement range of the second guide cup 41.

As shown in FIGS. 1 and 2, the outer periphery of the lower area of the first guide cup 31, the second guide cup 41, and the third guide cup 51 is provided with a first process-liquid recovery tank 61 that recovers the acidic process-liquid guided by the first guide cup 31. The inner periphery of the first process-liquid recovery tank 61 is provided with a second process-liquid recovery tank 62 that recovers the alkaline process-liquid guided by the second guide cup 41. The inner periphery of the second process-liquid recovery tank 62 is provided with a third process-liquid recovery tank 63 that recovers the organic process-liquid guided by the third guide cup 51. Furthermore, the inner periphery of the third process-liquid recovery tank 63 is provided with a fourth process-liquid recovery tank 64 that recovers the mixture of the process-liquids when the substrate holding table 12 rotates at a low speed.

A first exhaust member (an exhaust member) 71 is provided between the first process-liquid recovery tank 61 and the second process-liquid recovery tank 62 to discharge an atmosphere around the wafer W via the first guide cup 31 and the second guide cup 41. It is desirable that the first exhaust member 71 has an annular planar cross-section and is provided to be coaxial with respect to each of the process-liquid recovery tanks 61 to 64. Further, a second exhaust member 72 is provided at the inner periphery of the fourth process-liquid recovery tank 64 to discharge an atmosphere around the wafer W via the third guide cup 51. The first exhaust member 71 and the second exhaust member 72 are integrally formed with each other at the downstream of the exhaust direction so that the exhaust from each of the exhaust members 71 and 72 merges. Further, the first exhaust member 71 and the second exhaust member 72 are connected to a suction driving unit 73 that suctions the contents in the interior of the first exhaust member 71 and in the interior of the second exhaust member 72.

A lower end portion 41b of the second guide cup 41 is provided with the guide member 81 that guides the process-liquid from the first guide cup 31 to the first process-liquid recovery tank 61 and guides the process-liquid from the second guide cup 41 to the second process-liquid recovery tank 62. The guide member 81 is formed in an annular shape as a whole to cover the upper side of the first exhaust member 71, and has a U-shaped cross-section that is open toward the first exhaust member 71. That is, the guide member 81 includes the guide member body 82 extending in the radial direction, an outer peripheral wall portion 83 extending downward from the outer peripheral end portion of the guide member body 82, and an inner peripheral wall portion 84 provided at the inner periphery more than the outer peripheral wall portion 83 and extending downward from the inner peripheral end portion of the guide member body 82. Among these, the outer peripheral wall portion 83 is disposed at a position corresponding to the first process-liquid recovery tank 61, that is, a position above the first process-liquid recovery tank 61. The inner peripheral wall portion is disposed at a position corresponding to the second process-liquid recovery tank 62, and is located above the second process-liquid recovery tank 62 in the state shown in FIG. 5. Further, it is desirable that the inner peripheral wall portion 84 extends downward more than the outer peripheral wall portion 83 and a lower end portion 84a of the inner peripheral wall portion 84 is inserted into the second process-liquid recovery tank 62 during the alkaline process as shown in FIG. 4. Accordingly, when the alkaline process-liquid is guided, the alkaline process-liquid may be reliably guided to the second process-liquid recovery tank 62. Further, the fitting portion 85 extends upward from the guide member body 82, and the fitting portion 85 is configured to be fitted to the fitting groove 43 provided at the lower portion of the second guide cup 41.

A substrate liquid processing apparatus 10 includes the up-down movement cylinder (a position adjustment mechanism, an up-down movement driving unit) 87 adjusting a positional relationship between the guide cups 31, 41, and 51 and the substrate holding table 12. The up-down movement cylinder 87 of the embodiment is configured to move up and down the second guide cup 41 and the third guide cup 51 with respect to the first guide cup 31 fixed to the liquid processing chamber 11. As shown in FIGS. 1 and 2, the up-down movement cylinder 87 is connected to the guide member body 82 via the connection member 86. The connection member 86 is configured to be slidable inside the up-down moving groove 36 of the first guide cup 31. In this manner, the second guide cup 41 is connected to the up-down movement cylinder 87 via the guide member 81, and is configured to move up and down with respect to the first guide cup 31. Furthermore, the connection member 86 and the guide member body 82 are connected at several portions with a predetermined interval in the circumferential direction, and prevents the stream of the acidic process-liquid or the like guided by the first guide cup 31 from being intercepted.

As shown in FIG. 2, the substrate liquid processing apparatus 10 includes the defining wall 88 that defines a passage from the second guide cup 41 to the second process-liquid recovery tank 62 and a passage from the third guide cup 51 to the third process-liquid recovery tank 63. The defining wall 88 is provided to extend upward through a space between the third downward extension portion 53 of the third guide cup 51 and the guide member 81 provided in the second guide cup body 42, from a position of a gap between the second process-liquid recovery tank 62 and the third process-liquid recovery tank 63. As described above, the third downward extension portion 53 of the third guide cup 51 is slidable along the defining wall 88 and is in contact with the defining wall 88 so that a gap between the defining wall 88 and the third downward extension portion 53 may be blocked when the third guide cup 51 moves upward to perform the drying process (refer to FIG. 5) and when the third guide cup 51 moves downward to perform the acidic process (refer to FIG. 2). Further, as described above, the upper end portion of the defining wall 88 is configured to freely come into contact with the contact portion 54 of the third guide cup 51.

As shown in FIG. 1, a control unit 91 is connected to the rotary motor 14 and the up-down movement cylinder 87. The rotary motor 14 and the up-down movement cylinder 87 are controlled by the control unit 91. Further, the control unit 91 is configured to select each process-liquid to be ejected onto the wafer W via the nozzle 15. That is, the acidic process-liquid is ejected from the nozzle 15 by the control unit 91 during the acidic process of the wafer W, the alkaline process-liquid is ejected from the nozzle 15 during the alkaline process of the wafer W, the rinse process-liquid is ejected from the nozzle 15 during the rinse process of the wafer W, and the organic process-liquid is ejected from the nozzle 15 during the drying process of the wafer W.

Incidentally, as shown in FIG. 1, the control unit 91 is connected with an input-output unit 92 including a keyboard used to enter a command and a display used to visually display the operation state of the substrate liquid processing apparatus 10 in order for a process manager or the like to manage the substrate liquid processing apparatus 10. Further, the control unit 91 is configured to be able to access a storage medium 93 storing a program or the like for realizing a process performed in the substrate liquid processing apparatus 10. The storage medium 93 may be configured as a known storage medium, that is, a memory such as a ROM and a RAM, a hard disc, a CD-ROM, a DVD-ROM, and a disc-like storage medium such as a flexible disc. In this manner, the substrate liquid processing apparatus 10 performs a process on the wafer W in a manner such that the control unit 91 executes the program or the like stored in advance on the storage medium 93.

Next, the operation of the embodiment with such a configuration, that is, a method of processing a substrate with a process-liquid according to the embodiment will be described. Furthermore, the operation of each component for performing the method of processing a substrate with a process-liquid, which is to be described below, is controlled by a control signal output from the control unit 91 based on a program stored in advance on the storage medium 93.

First, as shown in FIGS. 1 and 2, the wafer W is loaded into the liquid processing chamber 11, and is held at the substrate holding table 12 by the holding member 12a.

Subsequently, the substrate holding table 12 holding the wafer W is rotationally driven by the rotary motor 14 together with the guide rotary cup 21 or the like. Accordingly, the wafer W held by the substrate holding table 12 rotates within the horizontal plane.

Next, the acidic process is performed on the wafer W by using the acidic process-liquid. In this case, the acidic process-liquid is supplied from a supply source (not shown) of the acidic process-liquid to the nozzle 15, and is ejected onto the surface of the rotating wafer W.

In this case, as shown in FIG. 2, the opening 31a of the first guide cup 31 is disposed at a position corresponding to the gap portion 23 between the guide rotary cup 21 and the outer peripheral end portion 12b of the substrate holding table 12. Accordingly, the acidic process-liquid with mist scattering from the wafer W, which is guided by the guide rotary cup 21, flows through the opening 31a of the first guide cup 31.

The acidic process-liquid flowing to the opening 31a of the first guide cup 31 is guided by the sloped portion 32b and the vertical portion 32c of the first guide cup body 32, and is recovered in the first process-liquid recovery tank 61 via the outer peripheral side of the outer peripheral wall portion 83 of the guide member 81. In this case, since the outer peripheral wall portion 83 of the guide member 81 is disposed above the first process-liquid recovery tank 61, the acidic process-liquid may be reliably guided to the first process-liquid recovery tank 61. Further, liquefaction of mist of the acidic process-liquid may be promoted by the guide member 81. Furthermore, since the suction driving unit 73 is driven, an atmosphere around the wafer W is guided in the same manner as the acidic process-liquid, and is discharged by the first exhaust member 71.

During the acidic process, the sloped portion 42b of the second guide cup body 42 overlaps the sloped portion 52b of the third guide cup body 52, so that the gap between the second guide cup 41 and the third guide cup 51 is blocked. Further, the inner peripheral end portion 52a of the third guide cup body 52 is close to the outer peripheral surface of the holding table lower member 24, and the opening 51a of the third guide cup 51 is closed. Accordingly, the acidic process-liquid passing the gap portion 23 may be suppressed from flowing to the second guide cup 41 and the third guide cup 51.

Further, since the guide rotary cup 21 rotates during the acidic process, the gas inside the gas guide space 35 turns along the first downward extension portion 33 due to the centrifugal force exerted thereon. The turning gas is guided downward along the first downward extension portion 33 since the upper portion of the gas guide space 35 is provided with the inner peripheral extension portion 34. In this case, since the stream of the gas from the gas guide space 35 into the first guide cup 31 is generated, the mist of the acidic process-liquid may be prevented from moving upward via a gap between the first guide cup 31 and the guide rotary cup 21. Further, since the first downward extension portion 33 extends from the inner peripheral end portion 32a of the first guide cup body 32 to the vicinity of the gap portion 23, the mist of the acidic process-liquid thrown off from the wafer W and rebounding from the inner surface of the first guide cup body 32 collides with the outer peripheral surface of the first downward extension portion 33 to be liquefied and moves downward along the first downward extension portion 33. Furthermore, even when the mist of the acidic process-liquid rebounding from the inner surface of the first guide cup body 32 adheres to the inner peripheral surface of the first downward extension portion 33, the adhering acidic process-liquid moves downward along the first downward extension portion 33 since there is the stream of the gas from the gas guide space 35 to the first guide cup 31.

After the completion of the acidic process of the wafer W, the rinse process is performed on the wafer W. In this case, the rinse process-liquid is supplied from a supply source (not shown) of the rinse process-liquid to the nozzle 15, and is ejected onto the surface of the rotating wafer W. In the meantime, the rinse process-liquid scattering from the wafer W is recovered in the first process-liquid recovery tank 61 in the same manner as in the process of the acidic process-liquid, and an atmosphere around the wafer W is discharged by the first exhaust member 71.

Next, the up-down movement cylinder 87 is driven, so that the second guide cup 41 and the third guide cup 51 move upward. In this case, first, the second guide cup 41 moves upward independently from the third guide cup 51. Subsequently, the protrusion 55 of the third guide cup 51 comes into contact with the guide member body 82 of the guide member 81, so that the third guide cup 51 is supported by the second guide cup 41. Then, the second guide cup 41 moves upward together with the third guide cup 51 until the opening 41a of the second guide cup 41 faces the gap portion 23. In this manner, each of the guide cups 31, 41, and 51 is disposed in a manner shown in FIG. 4. In this case, although the sloped portion 32b of the first guide cup body 32 and the sloped portion 42b of the second guide cup body 42 is away from each other, the lower end portion 33a of the first downward extension portion 33 of the first guide cup 31 is close to the inner peripheral end portion 42a of the second guide cup body 42, and the opening 31a of the first guide cup 31 is closed by the first downward extension portion 33. Further, the inner peripheral end portion 52a of the third guide cup body 52 is close to the outer peripheral surface of the holding table lower member 24, and the opening 51a of the third guide cup 51 is closed. Further, at this time, the lower end portion 84a of the inner peripheral wall portion 84 of the guide member 81 is still inserted in the second process-liquid recovery tank 72.

Subsequently, the alkaline process is performed on the wafer W by using the alkaline process-liquid. In this case, the alkaline process-liquid is supplied from a supply source (not shown) of the alkaline process-liquid to the nozzle 15, and is ejected onto the surface of the rotating wafer W.

As shown in FIG. 4, the alkaline process-liquid flowing to the opening 41a of the second guide cup 41 is guided by the second guide cup body 42, and is recovered in the second process-liquid recovery tank 62 via a gap between the inner peripheral wall portion 84 of the guide member 81 and the defining wall 88. In this case, since the lower end portion 84a of the inner peripheral wall portion 84 of the guide member 81 is inserted in the second process-liquid recovery tank 62, the alkaline process-liquid may be reliably guided to the second process-liquid recovery tank 62. Further, liquefaction of mist of the alkaline process-liquid may be promoted by the guide member 81. Furthermore, since the suction driving unit 73 is driven, an atmosphere around the wafer W is guided in the same manner as the alkaline process-liquid, and is discharged by the first exhaust member 71.

During the alkaline process, the alkaline process-liquid with mist scattering from the wafer W, which is guided by the guide rotary cup 21, flows to the opening 41a of the second guide cup 41. At this time, since the opening 31a of the first guide cup 31 and the opening 51a of the third guide cup 51 are closed, the alkaline process-liquid passing the gap portion 23 may be suppressed from flowing to the first guide cup 31 and the third guide cup 51.

Further, since the vertical positional relationship between the guide rotary cup 21 and the first guide cup 31 during the alkaline process is the same as that of the acidic process, a gas guide space 35 is formed in the same manner as in the acidic process. For this reason, a stream of a gas from the gas guide space 35 into the second guide cup 41 is generated.

After the completion of the alkaline process of the wafer W, the rinse process is performed on the wafer W. In this case, the rinse process-liquid is supplied from a supply source (not shown) of the rinse process-liquid to the nozzle 15, and is ejected onto the surface of the rotating wafer W. In the meantime, the rinse process-liquid scattering from the wafer W is recovered in the second process-liquid recovery tank 62 in the same manner as in the alkaline process-liquid, and an atmosphere around the wafer W is discharged by the first exhaust member 71.

Next, the up-down movement cylinder 87 is driven, so that the second guide cup 41 and the third guide cup 51 move upward. In this case, the second guide cup 41 moves upward together with the third guide cup 51 while the third guide cup 51 is supported by the second guide cup 41 until the opening 51a of the third guide cup 51 faces the gap portion 23. In this manner, each of the guide cups 31, 41, and 51 is disposed in a manner shown in FIG. 5. In this case, the sloped portion 32b of the first guide cup body 32 overlaps the sloped portion 42b of the second guide cup body 42, so that the gap between the first guide cup 31 and the second guide cup 41 is blocked. Further, although the sloped portion 42b of the second guide cup body 42 and the sloped portion 52b of the third guide cup body 52 are away from each other, the lower end portion 33a of the first downward extension portion 33 of the first guide cup 31 is close to the inner peripheral end portion 52a of the third guide cup body 52 and the opening 41a of the second guide cup 41 is closed.

Subsequently, the drying process is performed on the wafer W by using the organic process-liquid. In this case, the organic process-liquid is supplied from a supply source (not shown) of the organic process-liquid to the nozzle 15, and is ejected onto the surface of the rotating wafer W.

The organic process-liquid flowing to the opening 51a of the third guide cup 51 is guided by the sloped portion 52b of the third guide cup body 52, the contact portion 54, and the third downward extension portion 53, and is recovered in the third process-liquid recovery tank 63 via a gap between the defining wall 88 and the holding table lower member 24. Further, since the suction driving unit 73 is driven, an atmosphere around the wafer W is guided in the same manner as in the organic process-liquid, and is discharged by the second exhaust member 72 via the upper side of the third process-liquid recovery tank 63 and the upper side of the fourth process-liquid recovery tank 64.

During the drying process, the gap between the first guide cup 31 and the second guide cup 41 is blocked, and the opening 41a of the second guide cup 41 is closed. Accordingly, the organic process-liquid passing the gap portion 23 may be suppressed from flowing to the first guide cup 31 and the second guide cup 41.

Further, since the vertical positional relationship between the guide rotary cup 21 and the first guide cup 31 during the drying process is the same as that of the acidic process, a guide space 35 is formed in the same manner as in the acidic process. For this reason, a stream of a gas from the gas guide space 35 into the third guide cup 51 is generated.

In this manner, the process of the wafer W is completed. Subsequently, the wafer W is removed from the substrate holding table 12 and is unloaded from the liquid processing chamber 11.

Subsequently, when the unprocessed wafer W is loaded and the acidic process is performed on the wafer W, the up-down movement cylinder 87 is driven, so that the second guide cup 41 and the third guide cup 51 move downward. In this case, first, the second guide cup 41 moves downward together with the third guide cup 51, and the contact portion 54 of the third guide cup 51 comes into contact with the upper end portion of the defining wall 88. Accordingly, the third guide cup 51 is supported by the defining wall 88. Subsequently, the second guide cup 41 further moves downward independently from the third guide cup 51, and the opening 31a of the first guide cup 31 faces the gap portion 23. In this case, the inner peripheral end portion 52a of the third guide cup body 52 is close to the outer peripheral surface of the holding table lower member 24, and the opening 51a of the third guide cup 51 is closed. Further, the second guide cup body 42 overlaps the third guide cup body 52, so that the gap between the second guide cup 41 and the third guide cup 51 is blocked. In this manner, each of the guide cups 31, 41, and 51 is disposed in a manner shown in FIG. 2. At this time, the lower end portion 84a of the inner peripheral wall portion 84 of the guide member 81 is inserted into the second process-liquid recovery tank 62.

Likewise, according to the embodiment, during the acidic process, the gas inside the gas guide space 35 is guided downward along the first downward extension portion 33 while turning by the centrifugal force exerted thereon due to the rotation of the guide rotary cup 21. Accordingly, a stream of a gas may be generated from the gas guide space 35 to the first guide cup 31. In particular, since the cross-section from the inner peripheral extension portion 34 to the first downward extension portion 33 is formed in a reverse U-shape, the gas inside the gas guide space 35 may be reliably guided into the first guide cup 31. Further, since the first guide cup 31 is fixed to the liquid processing chamber 11, the vertical positional relationship between the guide rotary cup 21 and the first guide cup 31 during the alkaline process and the drying process is maintained in said relationship during the acidic process. That is, said vertical positional relationship is maintained constant during the process of the wafer W. Accordingly, the stream of the gas may be generated from the gas guide space 35 to the second guide cup 41 even during the alkaline process, and the stream of the gas may be generated from the gas guide space 35 to the third guide cup 51 during the drying process. For this reason, each process-liquid may be prevented from moving upward via the gap between the first guide cup 31 and the guide rotary cup 21. As a result, each process-liquid scattering from the wafer W may be prevented from adhering to the wafer W again, and the production of particle may be controlled. Further, in this case, the process-liquids may be reliably guided to the corresponding process-liquid recovery tanks 61, 62, and 63 via the corresponding guide cups 31, 41, and 51. For this reason, the recovery rate of each process-liquid may be improved.

According to the embodiment, the first downward extension portion 33 extends from the inner peripheral end portion 32a of the first guide cup body 32 to the vicinity of the gap portion 23. Accordingly, the acidic process-liquid thrown off from the wafer W and rebounding from the inner surface of the first guide cup body 32 may be liquefied by colliding with the outer peripheral surface of the first downward extension portion 33 and then thus move downward. For this reason, even the acidic process-liquid rebounding from the inner surface of the first guide cup body 32 may be guided to the first process-liquid recovery tank 61 via the first guide cup 31.

According to the embodiment, the guide member 81 is provided at the lower end portion 41b of the second guide cup

41. Accordingly, the acidic process-liquid guided by the first guide cup 31 may be suppressed from directly flowing to the first exhaust member 71, and the acidic process-liquid may be guided to the first process-liquid recovery tank 61. Further, the alkaline process-liquid guided by the second guide cup 41 may be suppressed from directly flowing to the first exhaust member 71, and the alkaline process-liquid may be guided to the second process-liquid recovery tank 62. Further, since the outer peripheral wall portion 83 of the guide member 81 is located above the first process-liquid recovery tank 61, the acidic process-liquid guided by the first guide cup 31 may be reliably guided to the first process-liquid recovery tank 61 by the outer peripheral wall portion 83 of the guide member 81. Further, since the lower end portion 84a of the inner peripheral wall portion 84 of the guide member 81 is inserted in the second process-liquid recovery tank 62 during the alkaline process, the alkaline process-liquid guided by the second guide cup 41 may be reliably guided to the second process-liquid recovery tank 62. For this reason, the recovery rate of each process-liquid scattering from the wafer W may be improved.

According to the embodiment, during the acidic process of the wafer W, the gap between the second guide cup 41 and the third guide cup 51 is blocked, and the opening 51a of the third guide cup 51 is closed since the inner peripheral end portion 52a of the third guide cup body 52 is close to the holding table lower member 24. Accordingly, the acidic process-liquid may be guided by the first guide cup 31 to be reliably recovered in the first process-liquid recovery tank 61. Further, during the alkaline process of the wafer W, the opening 31a of the first downward extension portion 33 of the first guide cup 31 is closed and the inner peripheral end portion 52a of the third guide cup body 52 is close to the holding table lower member 24, so that the opening 51a of the third guide cup 51 is closed. Accordingly, the alkaline process-liquid may be guided by the second guide cup 41 to be reliably recovered in the second process-liquid recovery tank 62. Furthermore, during the drying process of the wafer W, the gap between the first guide cup 31 and the second guide cup 41 is blocked, and the first downward extension portion 33 of the first guide cup 31 closes the opening 41a of the second guide cup 41. Accordingly, the organic process-liquid may be guided by the third guide cup 51 to be reliably recovered in the third process-liquid recovery tank 63. For this reason, the recovery rate of each process-liquid scattering from the wafer W may be improved.

Furthermore, according to the embodiment, the defining wall 88 is provided between the guide member 81 provided in the second guide cup 41 and the third downward extension portion 53 of the third guide cup 51. Accordingly, the alkaline process-liquid guided by the second guide cup 41 may be prevented from flowing to the third process-liquid recovery tank 63, and the organic process-liquid guided by the third guide cup 51 may be prevented from flowing to the second process-liquid recovery tank 62. For this reason, the recovery rate of each process-liquid scattering from the wafer W may be improved.

While the embodiments of the present invention have been described and illustrated above, those may be, of course, modified into various forms within the scope of the concept of the present invention. Hereinafter, representative modified examples will be described.

That is, in the embodiment, an example has been described in which the inner peripheral extension portion 34 of the first guide cup 31 extends from the inner peripheral end portion 32a of the first guide cup body 32 toward the guide rotary cup 21 and the cross-section from the inner peripheral extension portion 34 to the first downward extension portion 33 is formed in a reverse U-shape. However, not limited thereto, the inner peripheral extension portion 34 may be formed in an arbitrary shape as long as the inner peripheral extension portion 34 extends inward more than the first downward extension portion 33 of the first guide cup 31 and guides downward the gas inside the gas guide space 35 while the guide rotary cup 21 rotates.

Further, in the embodiment, an example of a three-stage cup structure including the first guide cup 31, the second guide cup 41, and the third guide cup 51 has been described. However, not limited thereto, the present invention may be applied to a configuration of a two-stage cup structure including only the first guide cup 31 and the second guide cup 41 or a configuration of a single-stage cup structure including only the first guide cup 31.

In the embodiment, an example has been described in which the third guide cup 51 is moved up and down together with the second guide cup 41 in a partial range of an up-down movement range of the second guide cup 41. However, not limited thereto, the second guide cup 41 may be configured to be moved up and down together with the third guide cup 51 on every occasion.

Further, in the embodiment, an example has been described in which the guide member 81 has a U-shaped cross-section that is open toward the first exhaust member 71. However, not limited thereto, the guide member 81 may have a flat-plate-like cross-section covering the upper side of the first exhaust member 71. Even in this case, the recovery rate of each process-liquid may be improved.

Furthermore, in the description above, an example has been described in which the substrate liquid processing apparatus, the method of processing a substrate with a process-liquid, and the storage medium storing the computer program for performing the method of processing a substrate with a process-liquid are applied to the cleaning process of the semiconductor wafer W. However, the present invention is not limited thereto and may be also applied to cleaning processes of various substrates such as an LCD substrate or a CD substrate.

The invention claimed is:

1. A substrate liquid processing apparatus comprising:
a substrate holding table configured to hold a substrate;
a rotary driving unit configured to rotate the substrate holding table;
a process-liquid supply unit configured to supply a process-liquid to the substrate held by the substrate holding table;
a guide rotary cup provided around the substrate holding table, the guide rotary cup being configured to rotate together with the substrate holding table to guide the process-liquid scattering from the rotating substrate; and
a guide cup provided around the guide rotary cup, the guide cup being configured to guide downward the process-liquid guided by the guide rotary cup,
wherein the guide cup includes a guide cup body, a downward extension portion extending downward from an inner peripheral end portion of the guide cup body, and an inner peripheral extension portion extending inward from the inner peripheral end portion more than the downward extension portion, the inner peripheral extension portion being configured to form a gas guide space to ether with the guide rotary cup and the downward extension portion so that a gas turning by the rotation of the guide rotary cup is guided downward,
wherein the process-liquid supply unit is configured to selectively supply a plurality of types of process-liquids, the substrate liquid processing apparatus further comprising a second guide cup provided below the guide cup, the second guide cup being configured to guide downward the corresponding process-liquid guided by the guide rotary cup; and an up-down movement driving unit configured to move up and down the second guide cup with respect to the guide cup, wherein the downward extension portion of the guide cup closes an opening of the guide cup when the process-liquid is guided by the second guide cup.

2. The substrate liquid processing apparatus according to claim 1, further comprising a third guide cup provided below the second guide cup, the third guide cup being configured to guide downward the corresponding process-liquid guided by the guide rotary cup, wherein the third guide cup is configured to be able to be moved up and down together with the second guide cup, and a gap between the guide cup and the second guide cup is blocked when the process-liquid is guided by the third guide cup, and the downward extension portion of the guide cup closes an opening of the second guide cup.

3. The substrate liquid processing apparatus according to claim 1, wherein an up-down moving groove is provided at an outer peripheral end portion of the guide cup body, the second guide cup and the up-down movement driving unit are connected to each other by a connection member, and the connection member is configured to be able to be moved up and down in the up-down moving groove.

4. The substrate liquid processing apparatus according to claim 1, wherein the guide cup body includes a sloped portion extending obliquely downward and outward and a vertical portion extending downward in a vertical direction from an outer peripheral end portion of the sloped portion, and the second guide cup is configured to be able to be moved up and down in a space between the downward extension portion of the guide cup and the vertical portion of the guide cup body.

5. The substrate liquid processing apparatus according to claim 1, wherein the vertical positional relationship between the guide rotary cup and the guide cup is maintained constant.

6. A substrate liquid processing apparatus comprising:
a substrate holding table configured to hold a substrate:
a rotary driving unit configured to rotate the substrate holding table;
a process-liquid supply unit configured to supply a process-liquid to the substrate held by the substrate holding table:
a guide rotary cup provided around the substrate holding table, the guide rotary cup being configured to rotate together with the substrate holding table to guide the process-liquid scattering from the rotating substrate; and
guide cup provided around the guide rotary cup, the guide cup being, configured to guide downward the process-liquid guided by the guide rotary cup, wherein the guide cup includes a guide cup body, a downward extension portion extending downward from an inner peripheral end portion of the guide cup body, and an inner peripheral extension portion extending inward from the inner peripheral end portion more than the downward extension portion, the inner peripheral extension portion being configured to form a gas guide space together with the guide rotary cup and the downward extension portion so that a gas turning by the rotation of the guide rotary cup is guided downward, wherein a cross-section from the inner peripheral extension portion of the guide cup to the downward extension portion is formed in a reverse U-shape.

7. A substrate liquid processing apparatus comprising:
a substrate holding table configured to hold a substrate:
rotary driving unit configured to rotate the substrate holding table;
a process-liquid supply unit configured to supply a process-liquid to the substrate held by the substrate holding table;
a guide rotary cup provided around the substrate holding table, the guide rotary cup being configured to rotate together with the substrate holding table to guide the process-liquid scattering from the rotating substrate; and
a guide cup provided around the guide rotary cup, the guide cup being configured to guide downward the process-liquid guided by the guide rotary cup, wherein the guide cup includes a guide cup body, a downward extension portion extending downward from an inner peripheral end portion of the guide cup body, and an inner peripheral extension portion extending inward from the inner peripheral end portion more than the downward extension portion, the inner peripheral extension portion being configured to form a gas guide space together with the guide rotary cup and the downward extension portion so that a gas turning by the rotation of the guide rotary cup is guided downward, wherein a gap portion is formed between an outer peripheral end portion of the guide rotary cup and an outer peripheral end portion of the substrate holding table so that the process-liquid scattering from the substrate passes through the gap portion, and a lower end portion of the downward extension portion of the guide cup is disposed above the gap portion.

* * * * *